(12) United States Patent
Mallinson

(10) Patent No.: US 8,984,035 B2
(45) Date of Patent: Mar. 17, 2015

(54) CHANNEL SELECT FILTER APPARATUS AND METHOD

(75) Inventor: Andrew Martin Mallinson, Kelowna (CA)

(73) Assignee: ESS Technology, Inc., Fremont, CA (US)

(*) Notice: Subject to any disclaimer, the term of this patent is extended or adjusted under 35 U.S.C. 154(b) by 746 days.

(21) Appl. No.: 13/145,748

(22) PCT Filed: Jan. 27, 2010

(86) PCT No.: PCT/US2010/022266
§ 371 (c)(1),
(2), (4) Date: Jul. 21, 2011

(87) PCT Pub. No.: WO2010/088293
PCT Pub. Date: Aug. 5, 2010

(65) Prior Publication Data
US 2011/0282924 A1    Nov. 17, 2011

Related U.S. Application Data

(60) Provisional application No. 61/147,826, filed on Jan. 28, 2009.

(51) Int. Cl.
*G06J 1/00* (2006.01)
*G06G 7/02* (2006.01)
*B60N 2/00* (2006.01)

(52) U.S. Cl.
CPC ..................................... *B60N 2/002* (2013.01)
USPC ............................................. 708/3; 708/819

(58) Field of Classification Search
CPC ..... H03H 15/00; H03H 15/02; H03H 19/004;
H03H 11/04; G06G 7/1928; G06J 1/00;
H03M 1/00; H03M 2201/4135; H03M
2201/4233; G06F 7/588
USPC ....................................................... 708/3, 819
See application file for complete search history.

(56) References Cited

U.S. PATENT DOCUMENTS

| | | |
|---|---|---|
| 4,475,170 A | 10/1984 | Haque |
| 6,035,320 A | 3/2000 | Kiriaki et al. |
| 7,028,070 B2 | 4/2006 | Mallinson |
| 7,251,268 B2 * | 7/2007 | Ali .................................. 375/150 |
| 2005/0053125 A1 | 3/2005 | Balamurugan et al. |
| 2007/0121765 A1 * | 5/2007 | Min et al. ...................... 375/343 |
| 2008/0159374 A1 | 7/2008 | Lin et al. |
| 2009/0075610 A1 * | 3/2009 | Keehr et al. .................... 455/137 |

FOREIGN PATENT DOCUMENTS

| | | |
|---|---|---|
| KR | 1998-0027536 | 7/1998 |
| KR | 2003-0069515 A | 8/2003 |
| KR | 2006-0090270 A | 8/2006 |

OTHER PUBLICATIONS

International Search Report dated Sep. 14, 2010 from corresponding PCT Application No. PCT/US2010/022266.
International Preliminary Report on Patentability for corresponding PCT Application No. PCT/US2010/022266.
Donald K. Weaver, Jr. "A Third Method of Generation and Detection of Single-Sideband Signals," Proceedings of the IRE, Jun. 25, 1956, pp. 1703-1705.
Yusuf A. Hague et al., "Distortion in Rotating Tap Weight Transversal Filters," IEEE Journal of Solid-State Circuits, vol. SC-14, No. 3, Jun. 1979, pp. 627-633.
Yusuf A. Hague et al., "An Electrically Programmable Transversal Filter" Electron Devices Meeting, 1976 International, vol. 22, pp. 27-30.

* cited by examiner

*Primary Examiner* — Tan V. Mai
(74) *Attorney, Agent, or Firm* — Kenta Suzue; Haynes Beffel & Wolfeld LLP Complex Filter Configuration

(57) ABSTRACT

Channel select filter circuits are described. One circuit implements a multiplying element and digital-to-analog converter as a differential current mode device. Another circuit implementing a multiplying element and digital-to-analog converter with weighted addition, deferred after multiplication of the digital-to-analog converter and multiplier combination. In one such circuit, substantially equal current source magnitudes are in different columns of the circuit. Another such circuit, with substantially equal current source magnitudes, uses non-radix2. Another such circuit, with substantially equal current source magnitudes, has partial segmentation. Another circuit implements a multiplying element and digital-to-analog converter, with partial segmentation, scrambling bit allocation for elements. One such circuit scrambles bit allocation on equally weighted segments, as described herein. Another circuit implements a multiplying element and digital-to-analog converter with selective enablement of duplicate current source devices. Another circuit implements a multiplying element and digital-to-analog converter with variable effective length of the digital-to-analog converter. In one such circuit one or more current sources of a multiplier element are deselected to remove a noise contribution of the multiplier element, as described herein. A complex filter circuit includes a pair of real finite impulse response filter circuits performing addition and subtraction in current domain, sharing a common resistor network to perform weighted addition. One such circuit further includes a second pair of real finite impulse response filter circuits performing addition and subtraction in current domain, sharing a second common resistor network to perform weighted addition.

4 Claims, 15 Drawing Sheets

| Coeff | DAC Bits | Coeff | DAC Bits | Coeff | DAC Bits | Coeff | DAC Bits |
|---|---|---|---|---|---|---|---|
| -2 | 2 | -19 | 6 | 48 | 7 | 17 | 6 |
| -3 | 3 | -18 | 6 | 27 | 6 | 95 | 8 |
| -5 | 4 | -13 | 5 | 1 | 2 | 166 | 9 |
| -7 | 4 | -5 | 4 | -27 | 6 | 220 | 9 |
| -9 | 5 | 5 | 4 | -53 | 7 | 247 | 9 |
| -11 | 5 | 15 | 5 | -73 | 8 | 239 | 9 |
| -14 | 5 | 25 | 6 | -83 | 8 | 194 | 9 |
| -15 | 5 | 33 | 7 | -82 | 8 | 113 | 8 |
| -16 | 5 | 37 | 7 | -68 | 8 | 4 | 4 |
| -15 | 5 | 36 | 7 | -42 | 7 | -121 | 8 |
| -13 | 5 | 31 | 6 | -9 | 5 | -245 | 9 |
| -10 | 5 | 21 | 6 | 29 | 6 | -351 | 10 |
| -5 | 4 | 8 | 5 | 66 | 8 | -420 | 10 |
| 1 | 2 | -7 | 4 | 96 | 8 | -435 | 10 |
| 7 | 4 | -21 | 6 | 114 | 8 | -383 | 10 |
| 14 | 5 | -33 | 7 | 117 | 8 | -259 | 10 |
| 20 | 6 | -41 | 7 | 102 | 8 | -62 | 7 |
| 24 | 6 | -43 | 7 | 71 | 8 | 198 | 9 |
| 26 | 6 | -38 | 7 | 27 | 6 | 508 | 10 |
| 26 | 6 | -27 | 6 | -25 | 6 | 845 | 11 |
| 23 | 6 | -11 | 5 | -77 | 8 | 1184 | 12 |
| 18 | 6 | 9 | 5 | -123 | 8 | 1497 | 12 |
| 12 | 5 | 29 | 6 | -154 | 9 | 1760 | 12 |
| 3 | 3 | 47 | 7 | -164 | 9 | 1948 | 12 |
| -5 | 4 | 60 | 7 | -151 | 9 | 2047 | 12 |
| -12 | 5 | 65 | 8 | -114 | 8 | | |
| -17 | 6 | 61 | 7 | -55 | 7 | | |

Fig. 15

| Bit00b | Bit01 | Bit01b | Bit02 | Bit02b | Code0 | Bit10 | Bit10b | Bit11 | Bit11b | Bit12 | Bit12b | Code1 | # |
|---|---|---|---|---|---|---|---|---|---|---|---|---|---|
| 0 | 1 | 0 | 1 | 0 | 3 | 1 | 0 | 0 | 1 | 0 | 1 | -1 | -1 |
| 1 | 0 | 1 | 1 | 0 | -1 | 1 | 0 | 1 | 0 | 0 | 1 | 1 | 3 |
| 0 | 1 | 0 | 1 | 0 | 3 | 1 | 0 | 1 | 0 | 1 | 0 | 3 | 15 |

Fig. 17

| Bit00b | Bit01 | Bit01b | Bit02 | Bit02b | Code0 | Bit10 | Bit10b | Bit11 | Bit11b | Bit12 | Bit12b | Code1 | # |
|---|---|---|---|---|---|---|---|---|---|---|---|---|---|
| 0 | 0 | 1 | 0 | 1 | -1 | 0 | 0 | 0 | 0 | 0 | 0 | 0 | -1 |
| 0 | 1 | 0 | 1 | 0 | 3 | 0 | 0 | 0 | 0 | 0 | 0 | 0 | 3 |
| 0 | 1 | 0 | 1 | 0 | 3 | 1 | 0 | 1 | 0 | 1 | 0 | 3 | 15 |

Fig. 18

CHANNEL SELECT FILTER APPARATUS AND METHOD

RELATED APPLICATION

This application is a U.S. National Stage of International PCT Application No. PCT/US2010/22266, filed on 27 Jan. 2010 which claims the benefit of U.S. Provisional Application No. 61/147,826, filed on 28 Jan. 2009. Both applications are incorporated herein by reference.

SUMMARY OF THE INVENTION

One aspect of the technology implements the multiplying element and DAC as a differential current mode device.

One aspect of the technology uses weighted addition deferred after multiplication of the DAC/Multiplier combination, allowing substantially equal DAC weights in columns of the differential current multiplier independent of bit position.

One aspect of the technology uses non-radix2 in the addition deferred after multiplication, operating the DAC as a partially segmented DAC, with correspondingly higher accuracy.

One aspect of the technology rotates or otherwise scrambles the bit allocation for elements in a segmented DAC, such as cases where the DAC is a segmented DAC and the scrambling is on the equally weighted segments.

One aspect of the technology implements the DAC by selectively enabling duplicates of the devices on the input port of the multiplier.

One aspect of the technology modifies the effective length of the DAC dependent upon the particular coefficient value by selecting neither of the duplicates of the devices on the input port of the multiplier, consequently enhancing the signal to noise ratio of the CSF and reducing its current.

One aspect of the technology uses one, some, or all the techniques described herein in a complex filter (one operating on complex numerical quantities) where the subtraction and addition is in the current domain, and two resistor networks rather than the expected four, are used to complete the weighted addition.

BRIEF DESCRIPTION OF THE DRAWINGS

FIG. 15 is a table of all coefficients of an example FIR filter.
FIG. 17 is a table of example encodings of bits, in a DAC configuration which does not reduce the length of the DAC.
FIG. 18 is a table of example encodings of bits, in a DAC configuration which does reduce the length of the DAC.

DETAILED DESCRIPTION

Figure 1:
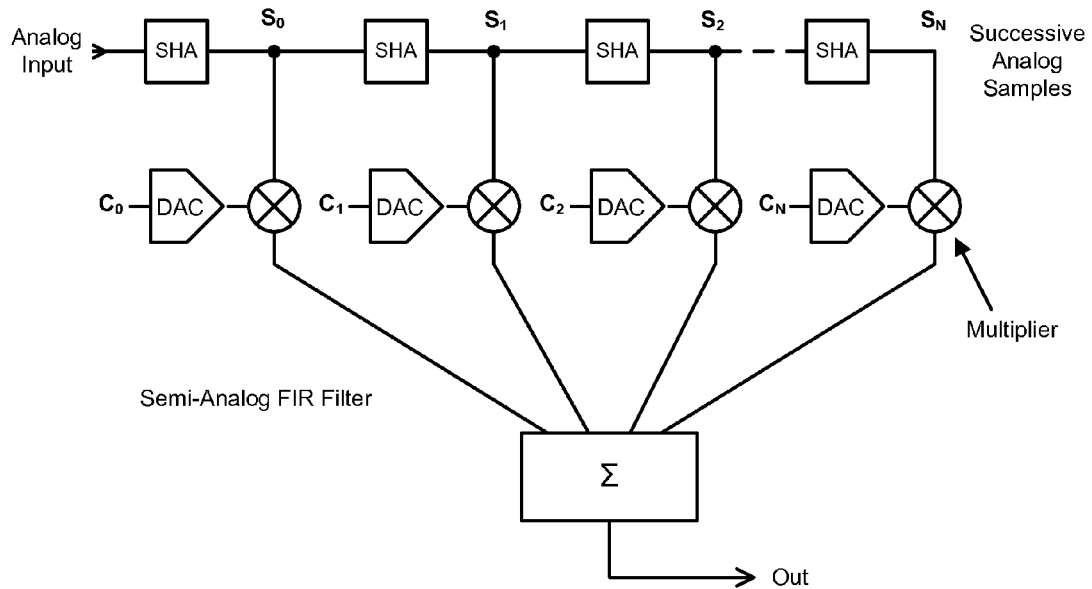
FIG. 1 shows an example of a semi-analog FIR.

An improved tuner such as for television relies on a Channel Select Filter (CSF) to define channel selection via frequency shaping, after the coarse tuning of a preceding Radio Frequency Digital Sampling Mixer (RFDSM). The quadrature output channels of the RFDSM operate at a variable internal intermediate frequency (IF), such as in a range of 8 to 14.5 MHz. The CSF is a complex semi-analog finite impulse response (FIR) filter. The complex filter operates upon signals represented as complex numbers, expressed as an in-phase signal and a quadrature signal (I and Q). The complex filter includes multiple FIR filters of taps (e.g., 160 taps) utilizing a digital-to-analog converter (DAC) at each tap position to generate the coefficient value. A set of samples of the signal are passed down a delay line and each is multiplied by the coefficient and summed to a single output. Four such filters are arranged to process the complex quadrature signals from the RFDSM. Consequently the CSF can select either the positive or the negative output frequency, suppressing the unwanted one of the pair.

The coefficients in the CSF are digital words, each independently adjustable. Because of this ability to change the coefficients, aspects of the CSF to be adjusted, such as bandwidth, steepness of band-edge, stop band rejection, or other frequency response shape. In response to a user selected channel and a subsequent adjustment of the RFDSM around a new internal IF frequency, the coefficients the CSF coefficients adjust to define a channel selection mask. Calibration is not required, as the CSF is precisely related to the clock and the filter shape achievable with the coefficients of the CSF are mathematically exact.

Additional details are described as follows. The CSF has an array of sample-and-hold circuits associated with a multiplier core and a digital-to-analog converter (DAC), e.g. 12 bit DAC. In the complex filter configuration, four banks of multiplier/DAC elements are arranged, e.g. four banks of 160 multiplier/DAC elements totaling 640 such multiplier/DAC elements. In the CSF FIR filter, the sample is analog and the multiplicand is the DAC output value. The rate of passage of the signal down the array of samplers is determined by the clock. Therefore the frequency shaping and the overall response characteristic are directly related to the clock with no error due to the value of on-chip components. Consequently, the band edge, for example, is precise.

The filter implements any shape with precision, limited by the 160 elements, per the Parks-McClellan algorithm sometimes referred to as the Remez Exchange algorithm. Because the preceding RFDSM is restricted to certain frequencies, the CSF constantly adjusts its bandpass position to center around the downmixed required signal. A ROM of precalculated coefficient values is provided on chip and a small DSP engine selects and loads the appropriate coefficient set given the user's selected receive frequency. In another embodiment, the CSF coefficients are loaded from the Inter-Integrated Circuit (I2C), subject to time constraints of loading.

Because the CSF is a sampled data system which samples the input signals (I and Q) from the RFDSM, an anti-aliasing filter (AAF) prevents the alias signal in continuous time, without affecting the band shaping. In one embodiment, the AAF is implemented with on-chip metal finger capacitors and poly-silicon resistors and is sufficiently precise to meet requirements without calibration.

Semi Analog Finite Impulse Response Filter

A Semi Analog Finite Impulse Response Filter (FIR) is a transversal filter implemented with coefficient values and samples, one of which is essentially digital and one of which is analog. Typically, the sample is analog and the coefficient is digital. The multiplication and summation to output is done in the analog domain, requiring that the digital coefficient value is rendered into an analog signal by a DAC, as shown in FIG. 1.

An issue with the semi-analog FIR filter of FIG. 1 is that implementation of the chain of Sample and Hold Amplifiers (SHA) is technically difficult, since each sample must progress down the chain at the sample interval; each sample experiences an imperfection, due to gain error, noise and so forth, resulting in a significantly corrupted sample in the final (right-most) SHA. Consequently, the architecture of FIG. 1 is rarely implemented (except perhaps in CCD devices where the passage of the signal from input to output of the SHA occurs with very low error).

Figure 2:
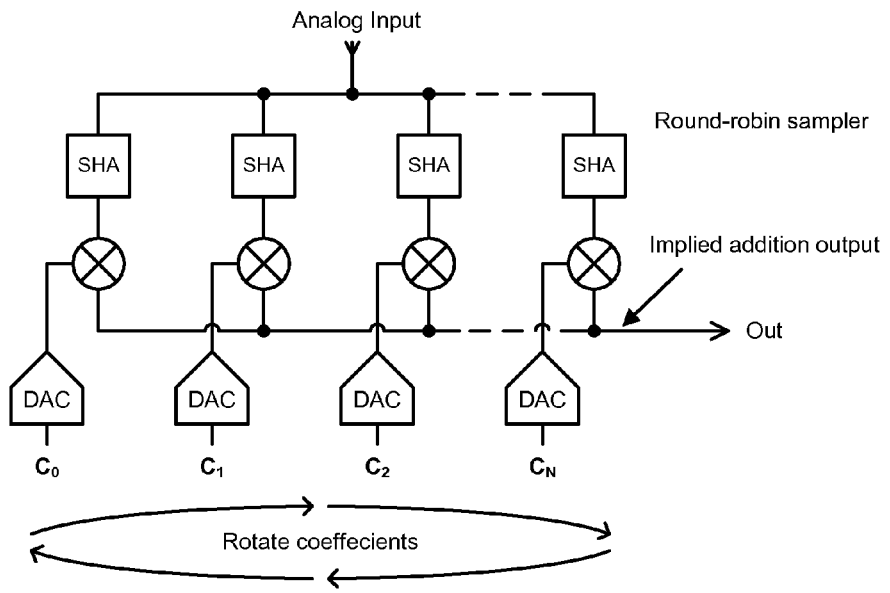
FIG. 2 shows another example of a semi-analog FIR

FIG. 2 shows a semi-analog FIR filter with rotated coefficients, an innovation that allows a "round robin" action in the analog sampler. Therefore any given analog sample is only processed once; it need not pass down a chain of SHAs. This represents a significant improvement. An undesirable consequence of this method is the appearance of fixed pattern noise due to coefficient value rotation.

The following will focus on the implementation of a semi analog FIR filter with rotating coefficients and implementation of the DAC and multiplier.

Figure 3:
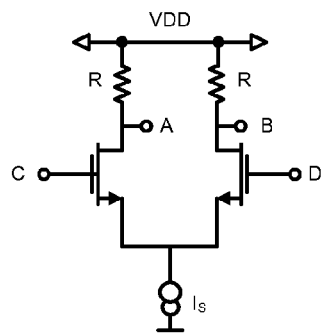
FIG. 3 shows an example of a simple multiplier.

FIG. 3 shows a simple multiplication available in an electronic circuit: a pair of three-terminal devices is used in the "long tailed pair" configuration with an adjustable tail current. (The drawing shows NMOS and the tail current IS, but just many other devices, e.g. bipolar, JFET, PMOS, etc. can be used). As the input parameter—the voltage between C and D—is changed, the output parameter—the voltage between A and B—also changes.

Figure 4:
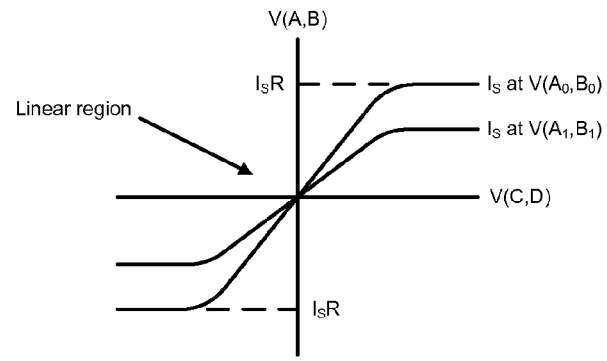
FIG. 4 is an example graph of a multiplier response including a linear region.

The relation of output change to input change is shown in the graph of FIG. 4. A typical S curve results. Symmetry results in a zero output for zero input independent of IS, and, due to the finite IS, the limit for large input must be an output of amplitude +/−IS*R. Multiplication action over a small linear range is apparent for inputs near zero; in this area the output parameter is proportional to the product of the current IS and the input value V(C,D). Analog multipliers exploit this region of multiplication action to varying degrees of sophistication. The Gilbert multiplier is a combination of three such elemental multipliers.

If the source IS was replaced by a DAC, and if the input parameter V(C,D) was the SHA output, such a simple multiplier may be viable as the DAC/Multiplier combination in a semi-analog FIR filter. Although the CSF can this simple multiplying core, our technology addresses a number of problems, not least of which are that the IS parameter is uni-polar, and the accuracy of this multiplier structure would be a limitation.

Multiplication in Differential Current Mode

Figure 5:
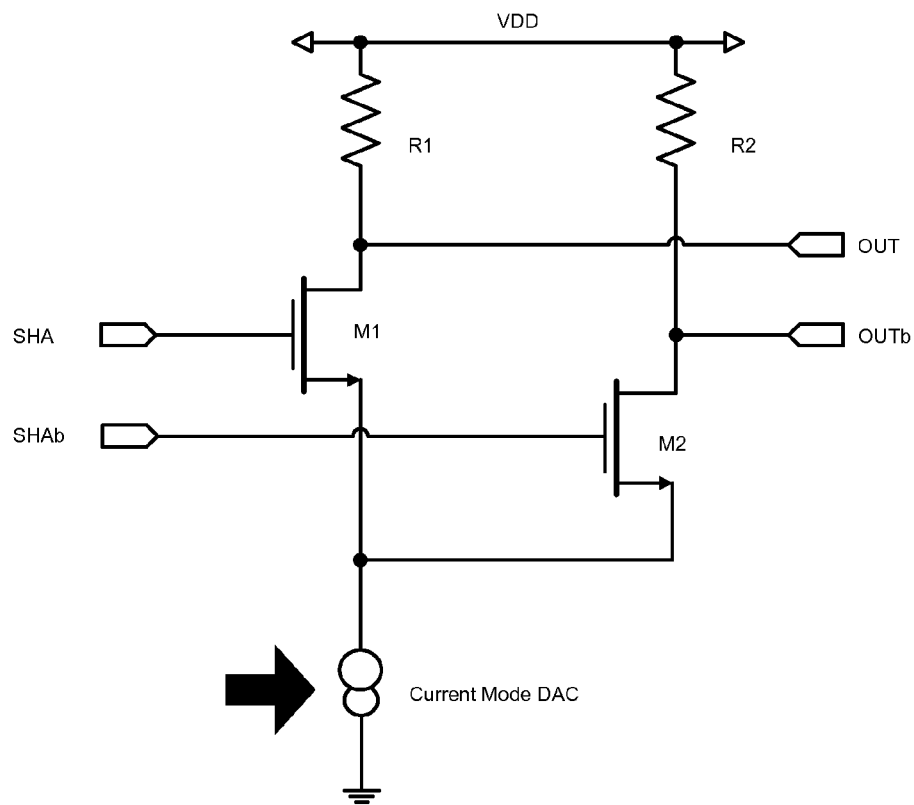
FIG. 5 shows an example of a simple multiplier.

The circuit of FIG. 5 is the simple multiplier. Signals near zero applied differentially to the SHA input port (SHA and SHAb—meaning "SHA-bar"—define the input port) are multiplied by the value of the current as set in the Current Mode DAC and appear as a voltage at the output port (between Out and Outb). This circuit of FIG. 5 has some disadvantages. For example, the DAC must always draw current out of the sources of M1 and M2, it cannot reverse in sign, and hence it is uni-polar.

Figure 6:
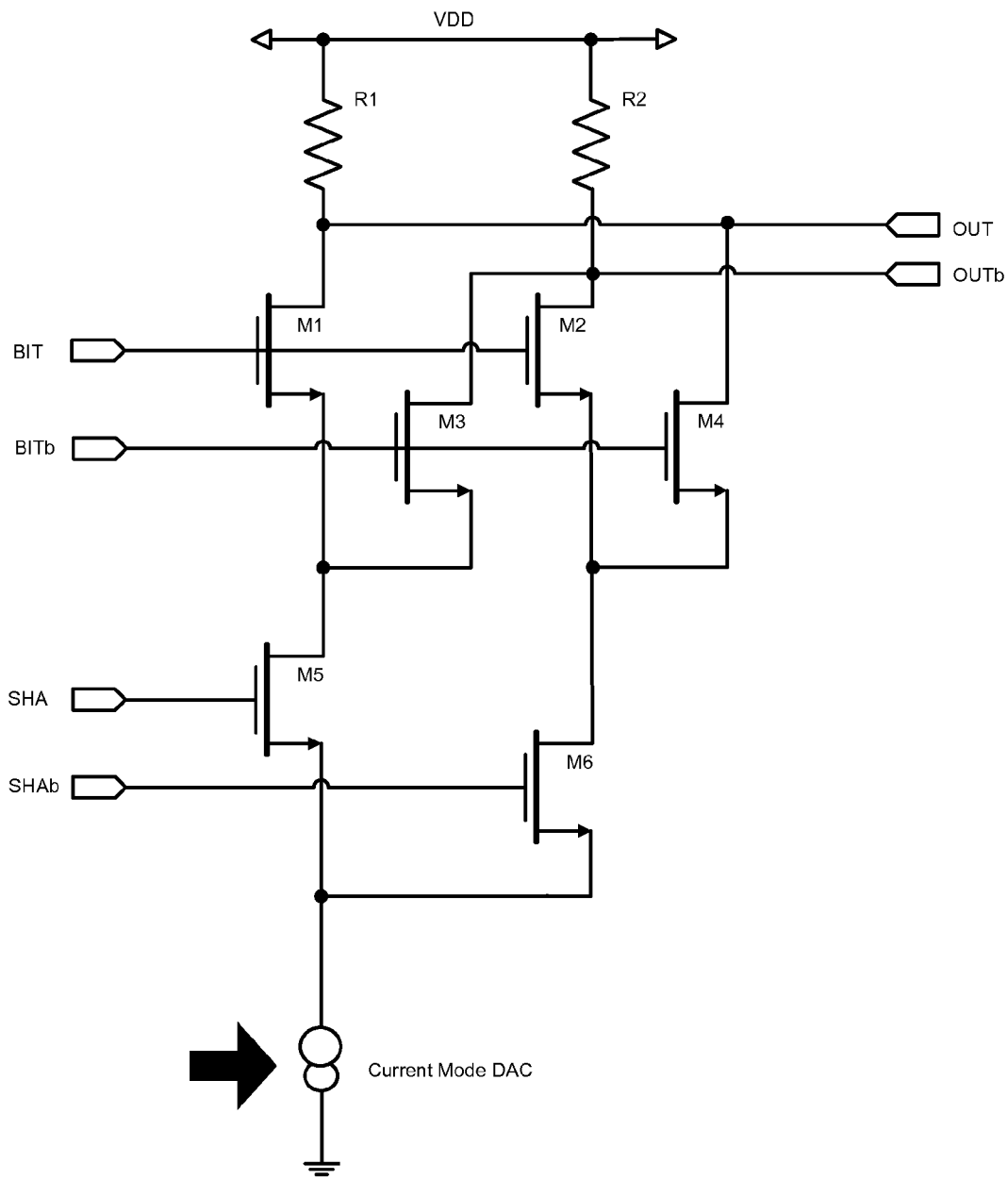
FIG. 6 shows an example of a multiplier with a binary control reversing the sign of the multiplier.

The circuit of FIG. 6 solves the uni-polar problem. The apparent sign of the DAC is reversed by activating the "reversing switch" arrangement on M1-4 (as controlled by Bit and Bitb). This circuit is distinct from the Gilbert multiplier, because the input Bit/Bitb is a binary control, i.e. two state, routing the output of M5 to R1 and M6 to R2, or conversely M5 to R2 and M6 to R1.

It is difficult to use the circuit of FIG. 6 to make the current mode DAC, since the DAC (which is ultimately going to be the source of our FIR coefficients) must rotate and rapidly and accurately change coefficient values. However, this current mode DAC is replaced with a constant current. The reversing switch arrangement is a one-bit DAC on its own, even if the DAC is fixed. Say that the DAC in FIG. 6 were simply set to a constant current, such as 10 uA. Then, if the Bit and Bitb signal were set to connect M5 to R1 and M6 to R2, we are multiplying the input signal (on SHA/SHAb) by +10 uA. But if the reversing switch were activated to connect M5 to R2 and M6 to R1 we are multiplying by −10 uA. Accordingly, we have two possible values of +10 uA or −10 uA; that is, we have one bit of control. Because each DAC/multiplier element has a single bit associated with the multiplication, the circuit operation is simpler.

Summing with Different Weights in the Output of One Coefficient DAC

Figure 7:
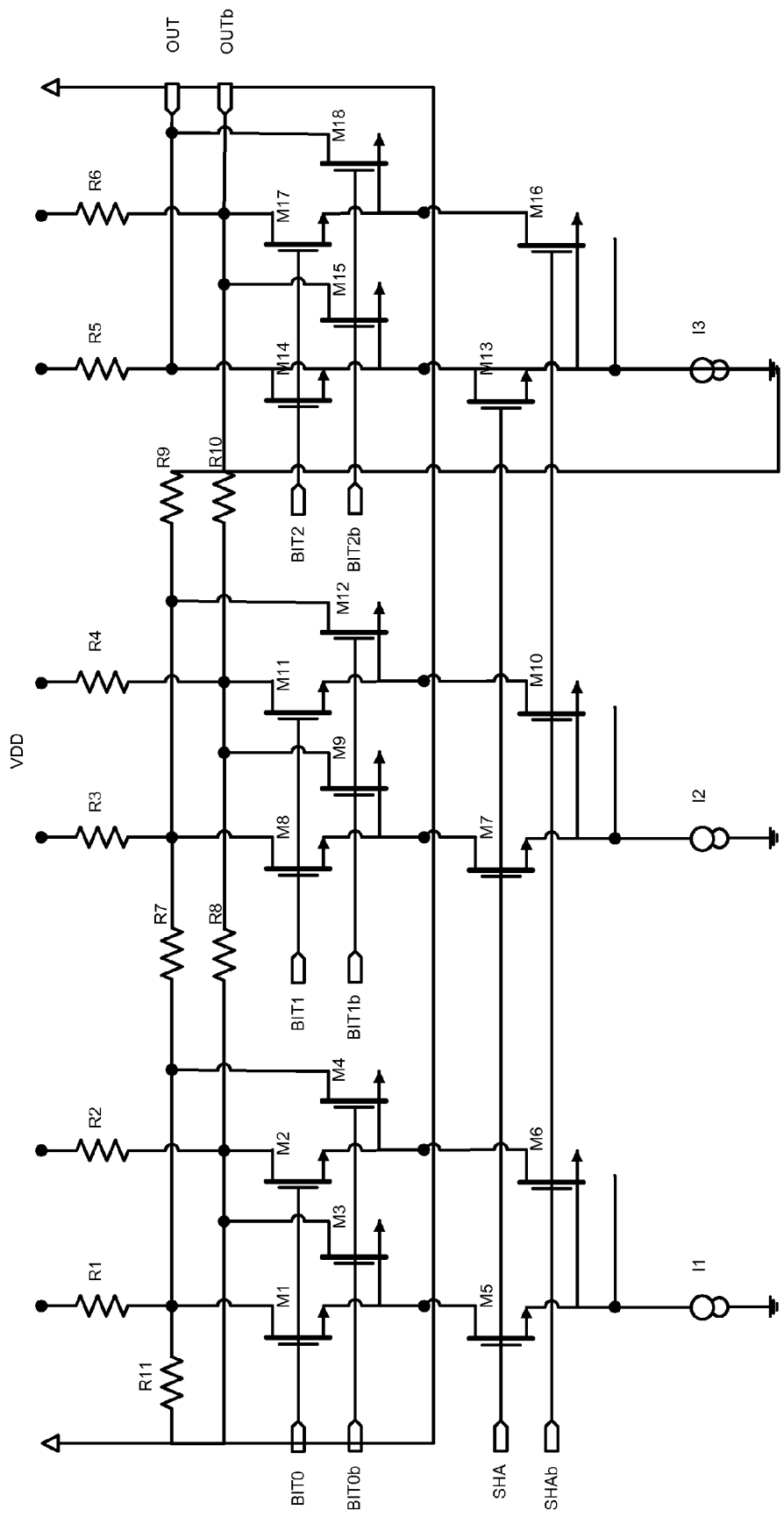
FIG. 7 shows an example of a single coefficient DAC summing different weights.

To extend this to more than one bit, rather than varying the current source, replicas of the circuit with fixed current source are added, as in FIG. 7. The common current source values avoid the problem of different switching speeds of current sources having varying magnitudes, especially between the largest magnitude current source and the smallest magnitude current source. Weighting, which would otherwise be performed by the varying current source magnitudes, is deferred until after the multiplication within the DAC cell. Accordingly, each DAC cell works on substantially equal currents.

The SHA input is shared, but the Bit is separate. The outputs add in a resistor network that applies a variable gain to the output node. The right hand block (controlled by Bit2/Bit2b) contributes an amount to the output that is two times that contribution of the middle block (controlled by Bit1/Bit1b), determined by the value of the resistors R9 and R10 in relation to R5 and R6. The left hand block (controlled by Bit0/Bit0b) contributes half again of the middle bit. The resistors make an R-2R ladder network with terminating resistor R11. Consequently, we have a three bit equivalent DAC.

Although we have a DAC, there is no variable current source and the multiplier core devices (M5/6, M7/10 and M13/16) work at the same constant current. This ensures good linearity. If the currents were to differ, the multiplication constant would change. To further clarify the operation at this point we can explicitly write the descriptive equation:

$$\text{Out} = B_3 \cdot SHA + \frac{B_2 \cdot SHA}{2} + \frac{B_3 \cdot SHA}{4} = SHA\left(B_3 + \frac{B_2}{2} + \frac{B_1}{4}\right)$$

where $B_n = \{-1, +1\}$. Clearly we have a 3 bit DAC multiplying the SHA.

Summing with Different Weights in the Output of a Complete FIR Filter

Figure 8:
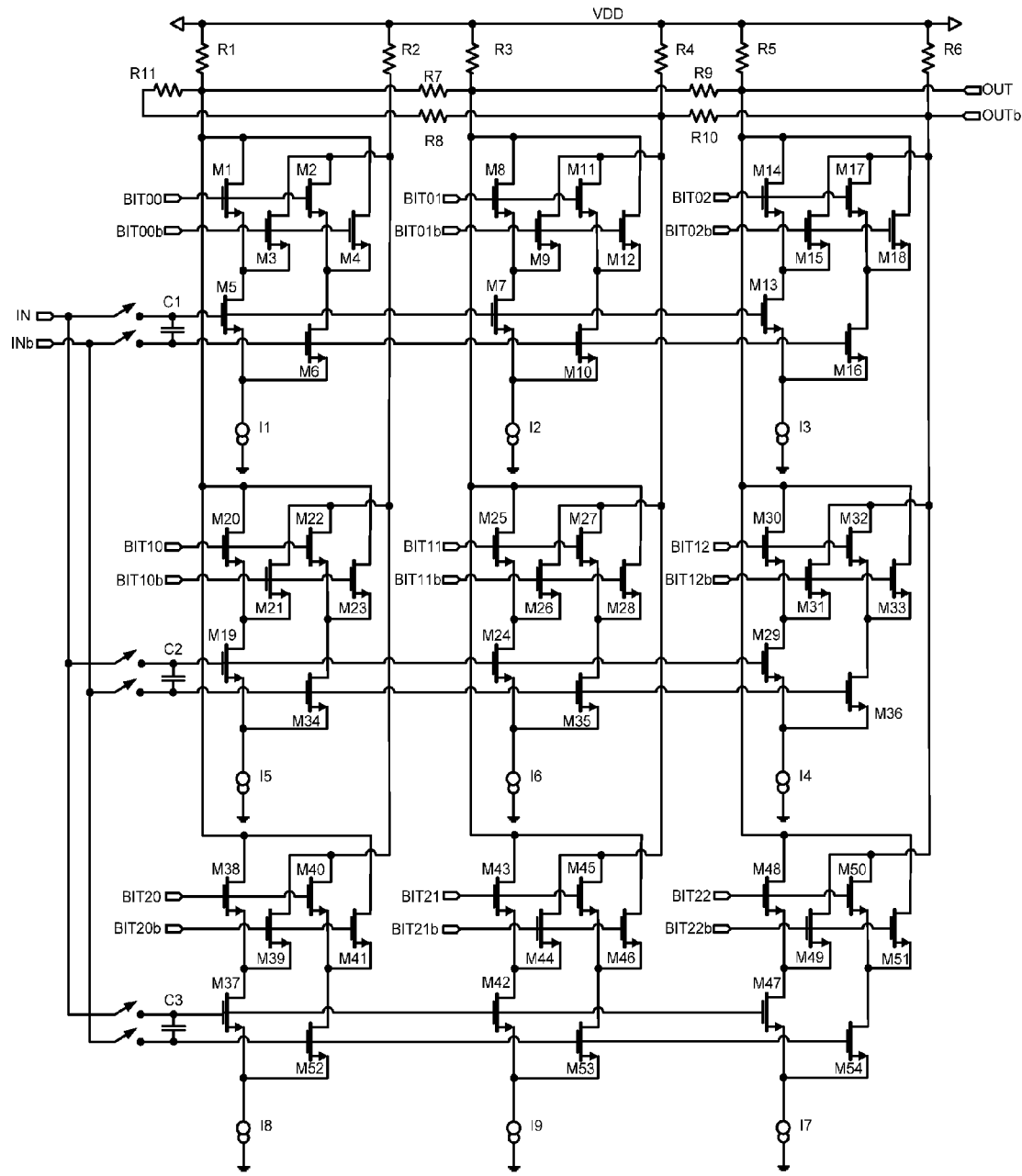
FIG. 8 shows an example of a complete DAC summing different weights.

This DAC is to be used in the CSF, i.e. in a semi-analog FIR filter. FIG. 8 shows a complete three tap, three bit DAC example. The addition of the multiplication which is weighted by the DAC, can be deferred yet again, and that the resistor network to do the addition occurs one time in this FIR filter.

Columns of similarly weighted multiplier cores are connected together. It is not required to provide a separate resistor network for each one. FIG. 8 also makes clear the sample and hold for each DAC row. The data in the DAC is not the same; the names Bit<n><m> indicate that all 9 data bits in this example are distinct. This technology is extensible in both DAC bus width and number of FIR taps. In a Complex Filter using this technology, only two resistor networks are needed, despite the fact that four complete FIR filters are used in such a filter.

Using non-Radix 2 to Provide Enhanced Accuracy and Segmented Operation

Figure 9:
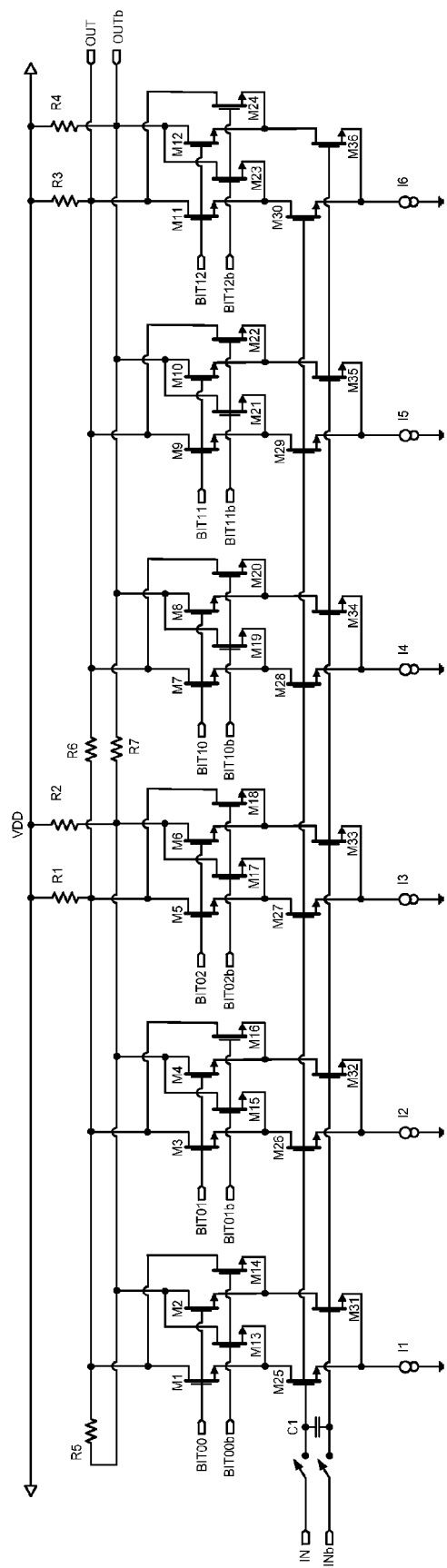
FIG. 9 shows an example of a non-radix 2 segmented DAC.

Up to this point the limitation of accuracy of the equivalent DAC is due to the resistor mismatch. If these resistors match to 0.1% then the overall DAC is correspondingly 0.1% accurate. Addition of more multiplier cells can improve this by converting the DAC to a partially so-called "segmented" DAC architecture. For example, three multiplier cores can add to make one compound core that has four possible operating conditions, as shown in FIG. 9.

Three of the multiplier sections add their output currents together into one resistor load network. That network then connects to the next compound group, not with a weight of (½), but with a weight of (¼). The effect of this is that two bits are available in each group of three cores and the resistors then provide the remaining relative weights. The burden on the resistor matching is therefore somewhat reduced and the DAC will have a high accuracy. Two bits are available from the three core cells, because the possible states are as shown in the following table, namely that there are four possible outputs −3, −1, +1, +3, the −1 and +1 states occurring multiple times.

| Left | Middle | Right | Result |
|------|--------|-------|--------|
| 0 | 0 | 0 | −3 |
| 0 | 0 | 1 | −1 |
| 0 | 1 | 0 | −1 |
| 0 | 1 | 1 | 1 |
| 1 | 0 | 0 | −1 |
| 1 | 0 | 1 | 1 |
| 1 | 1 | 0 | 1 |
| 1 | 1 | 1 | +3 |

The redundancy in the codes is exploited in the programming sequence. For example, the three codes that represent −1 are each chosen in turn when needed. This differs from a typical decision to choose say, L=0, M=0, R=1 as the code for −1 all the time and causes the mismatch that may exist between Left Middle and Right cells to be scrambled.

The choice of three sections per bit is exemplary. More sections can be chosen, and further that the segmentation need not continue to the LSB—by the time we reach the LSB bit positions the inherent matching is more than adequate to meet requirements. Various embodiments do not segment one or more of the lower order bits. In summary, operation with other than radix two gives two benefits: the resistor need not match the equivalent DAC accuracy, hence system accuracy is improved; and secondly redundancies in coding may be exploited to "scramble" and matching error within a segment group.

Selectively Enabling Duplicate Input Devices

The fixed current source that replaced the DAC in various embodiments has been shown as a symbol, not exposing the actual transistors that make up the current source. Some embodiments use a current source as follows.

Figure 10:
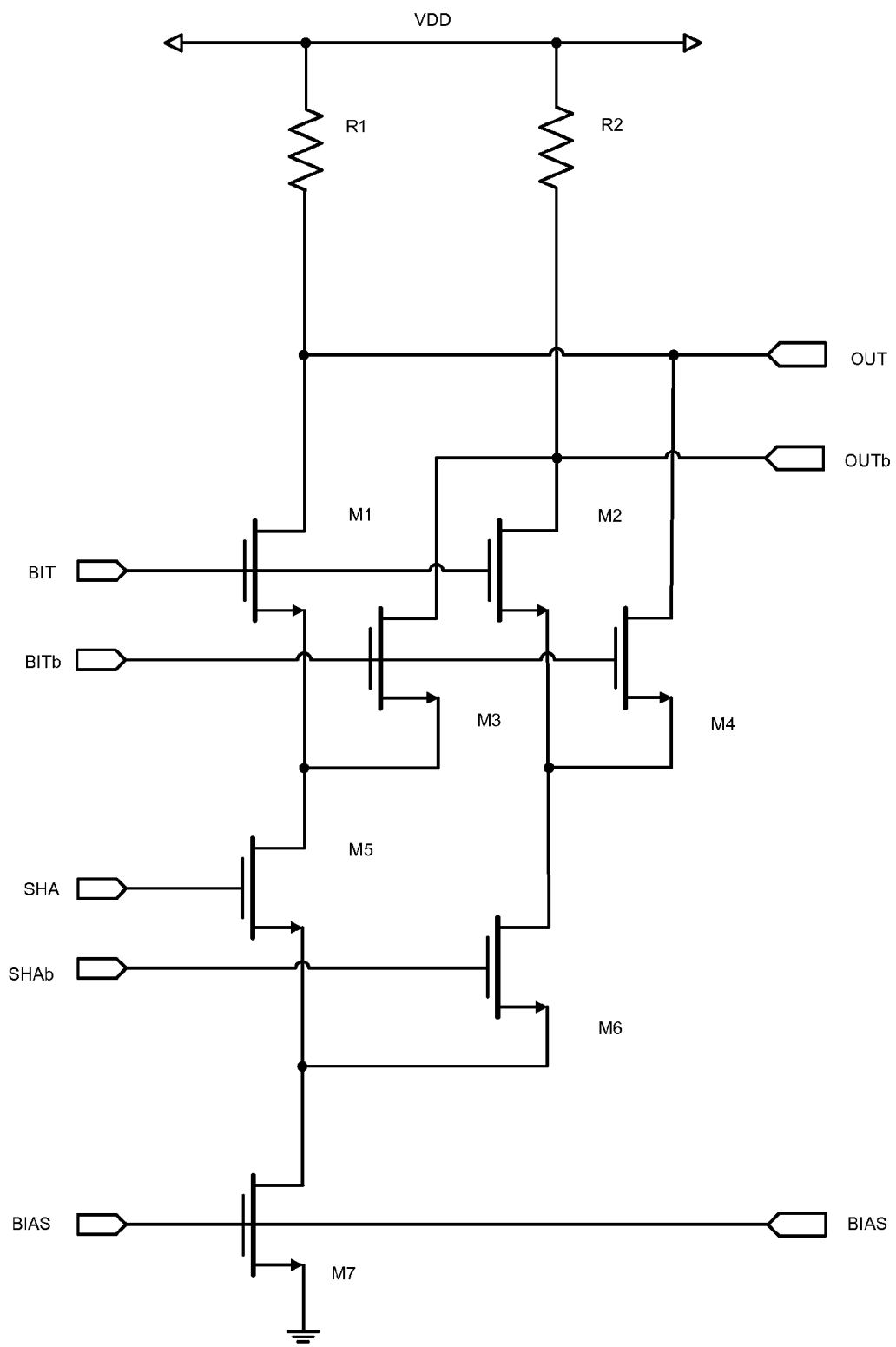
FIG. 10 shows an example of a simple multiplier with a single device current source.
Figure 11:
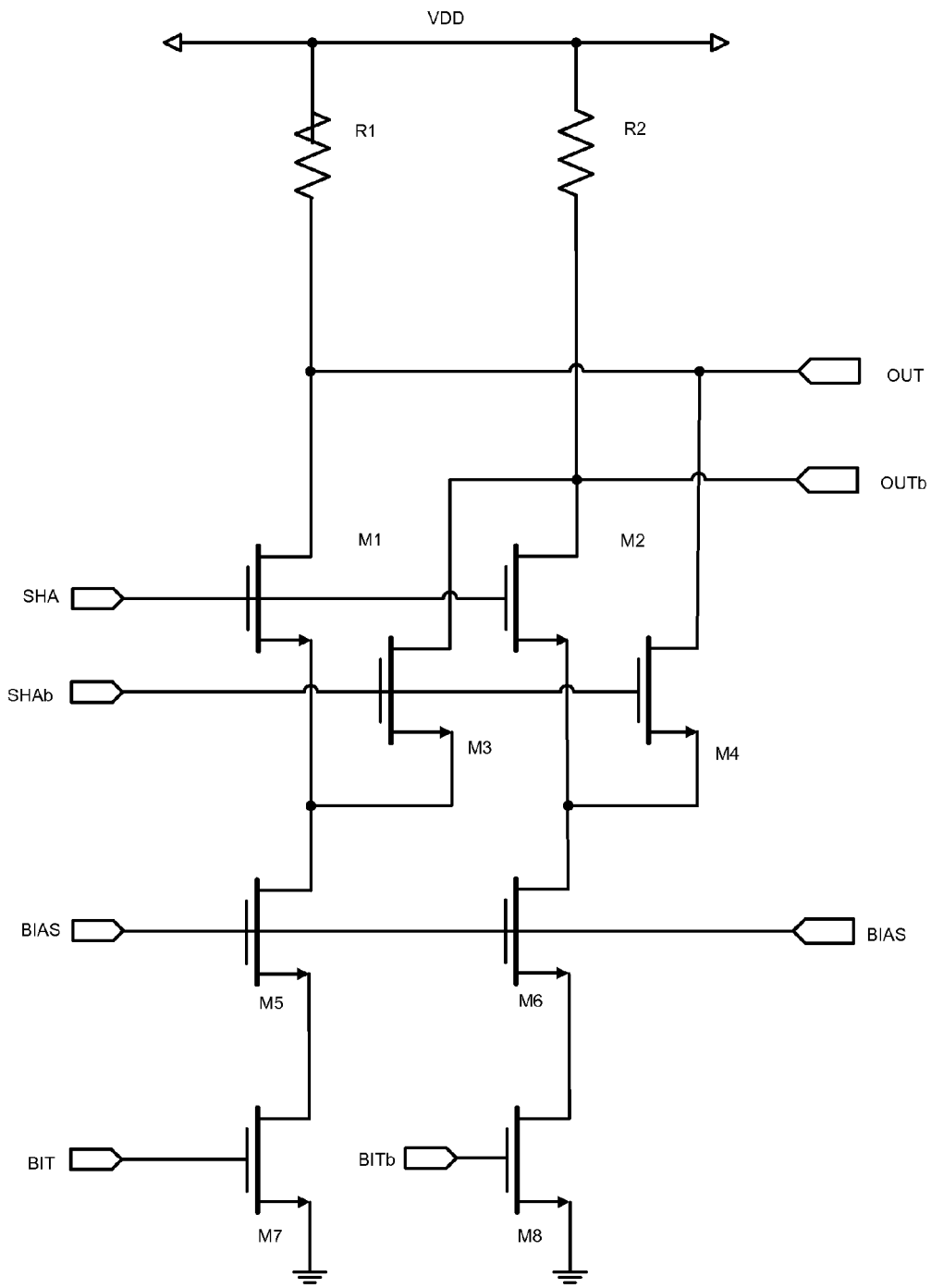
FIG. 11 shows an example of a simple multiplier with a switchable pair of device current sources.

FIG. 10 shows the multiplier core with reversing switch arrangement where the current source is now seen to be a single device (M7) operating at a fixed bias. The presence of additional resistance in the source of M7 does not, in general, degrade the operation of the current source. FIG. 11 removes the reversing switch arrangement and substitutes a second input pair connected opposite to the first. The 'Bit' input activates one of two current source devices and determines which input group is active and chooses multiplication by +1 or −1.

Modification to the Effective DAC Length

The duplication of input pairs and removal of reversing arrangement has advantages described in the following.

Figures 12, 13:
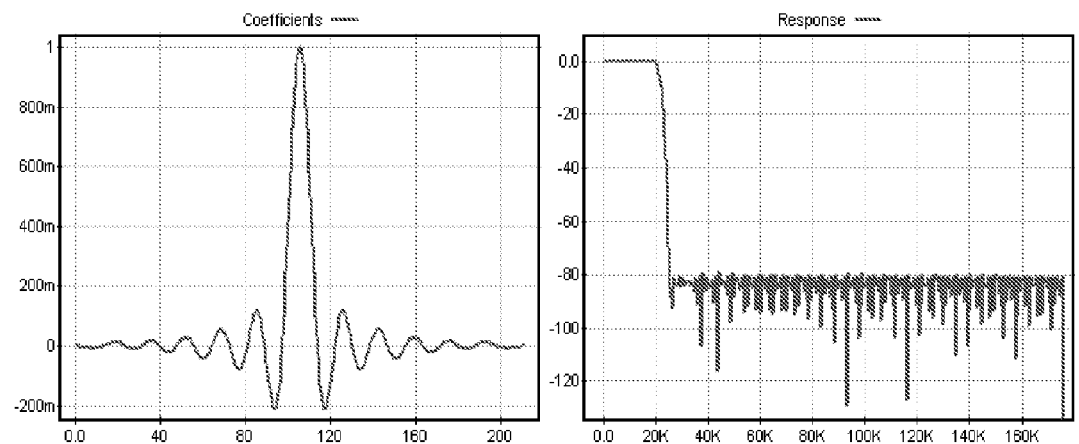
FIG. 12 is a graph of the coefficients of an example FIR filter.
FIG. 13 is a graph of the response of an example FIR filter.
Figure 14:
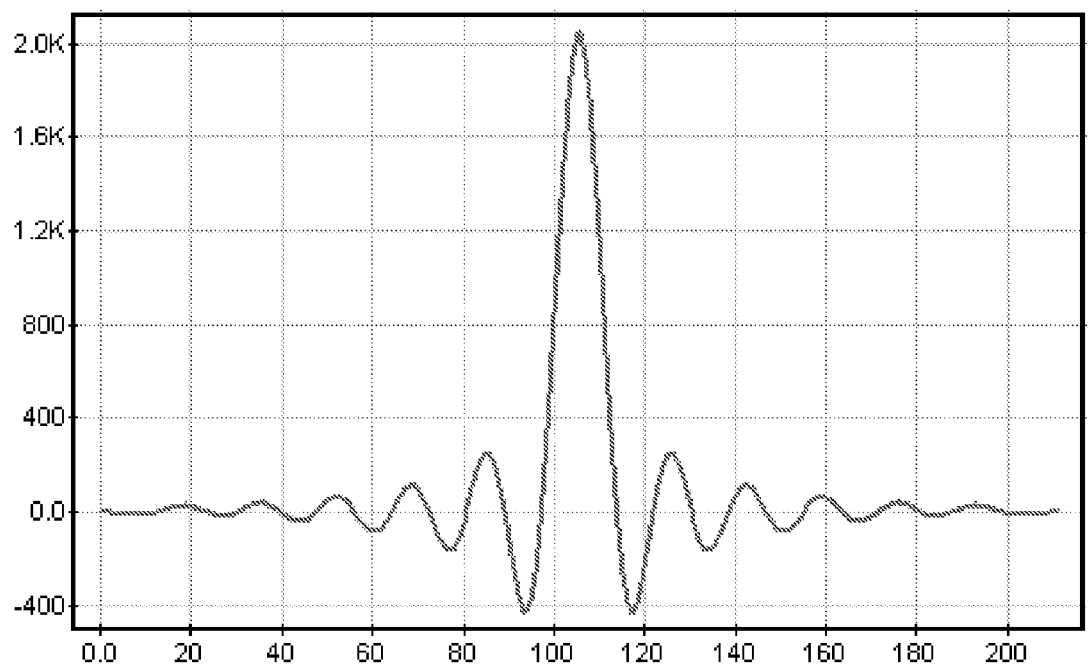
FIG. 14 is a graph of the coefficients of an example FIR filter scaled to 2047.

FIGS. 12 and 13 show a typical FIR filter. This FIR filter has 212 coefficient values. The average value of the coefficients is quite small. In this example (where the peak has been scaled to 1.0) the RMS value is about 0.19. To use the semi-analog FIR filter, the coefficients are encoded into a DAC. As an example, we encode these values into a 12 bit DAC (a DAC that can provide 4096 different output states). The numbers are signed, such that both positive and negative values are represented. Consequently the best we can do is make the peak equal to 2047, scaling the others proportionally. The resulting DAC values are shown in FIG. 14.

Each of these 212 coefficients is expressed as a DAC value in the 212 DACs that make up the semi-analog FIR filter. These DAC values will rotate as disclosed. Most of the DAC values are small. In this example, there are 36 values that are less than 10. The design can be optimized, such that when fewer than 12 bits are needed, which is quite frequently, some resource may be saved.

The table of FIG. 15 shows all the coefficient values in the example FIR filter, and the number of DAC bits required to represent that particular coefficient value. The FIR filter in this example has an even number of components and is symmetric; the second set of 106 coefficients in this 212 tap example filter is a mirror-image of the first set of 106 coefficients. Only the first 106 tap values are shown in the table. Each one of these table entries appears two times in the filter. Most of the time far fewer than 12 bits are needed, and the average number of DAC bits needed is 6.8, not 12. We can take advantage of this. We review how a differential current mode DAC works, and specifically how the DAC/Multiplier of our FIR filter operates. The segmented architecture radix-4 is used as an example, but any differential current mode DAC can be used.

A 12 bit radix-4 segmented current mode DAC has six two bit sections. It is made up of six groups of three elements. (Two groups of three elements are shown in the schematic on FIG. 9.) Each of these three elements can represent −3, −1, 1 or 3, hence two binary bits. Each of these groups is then added with a weight of four to create the effective DAC value.

For example, this DAC creates the equivalent of +999. It does so by encoding (from MSB to LSB) the sequence (1, −1, 3, 3, −3, 3). This can be verified by forming the summation 1*1024−1*256+3*64+3*16−3*4+3=999. The code applied to the segmented DAC sections would then be 110,100,111, 111,000,111 (as appear in the table accompanying the description of FIG. 9).

In another example, the DAC representing −27 does so by encoding (−1, 3, 3, 3, −3, 1), which is confirmed by forming the summation −1*1024+3*256+3*64+3*16−3*4+1=−27.

The DAC size can be reduced. To create the number −27, we first encoded −1024, the bulk of which canceled out by adding first 768 (i.e. 3*256) then 192 (i.e. 3*64), finally leaving −27. Various embodiments dispense with adding the current and noise associated with the encoding of −1024, 768 and 192 since these values largely cancel out one another. In some specific example of encoding −27, a segmented DACs of only three groups of three is sufficient. It can encode −27 as (−1, −3, 1) as confirmed by the summation −1*16−3*4+1−= 27. Accordingly, various embodiments simplify the circuitry, reduce current, and limit noise. In the differential current mode DAC, the quantity zero is represented as two currents that are the same: the current in the left branch being made equal to the current in the right branch. The difference in current is zero, and hence the two equal currents represent zero signal. But two currents are never equal, and have noise associated with them. This noise does not reduce to zero, and in fact adds root-sum-square (i.e. it increases). Consequently, an improvement is made not by the cancellation of large quantities, but by the removal of the segmented DAC currents of the higher order bits when not needed.

Some DAC embodiments cannot create an even number; all numbers of such DACs are odd. (e.g., in the range −4095 to +4095 in steps of 2, with 4095 such numbers with this DAC being very nearly 12 bits.)

Figure 16:
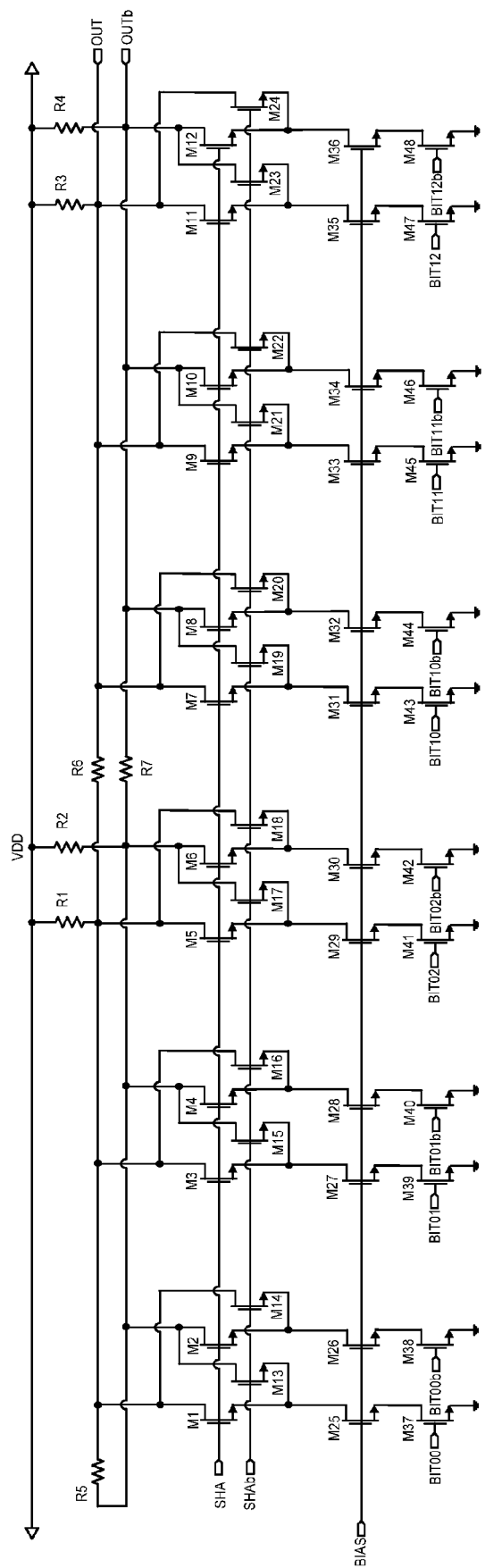
FIG. 16 shows an example of a DAC with reducible length.

We encode DAC values into the electronic devices when we use the duplicate input device method as shown in FIG. 16. (compare to FIG. 9 which uses the reversing switch arrangement).

The bits are shown in the table of FIG. 17, and examples of encoding are shown. Following the schematic drawing of FIG. 16, the LSB is on the left. The final column (#) is equal to Code0+4*Code1, as required for this simple example of two groups of three elements.

In the encoding whenever a Bit is set, the corresponding Bitb is unset and so forth. We are connecting either the input pair that connects one way to the output bus, or the input pair that connects the opposite way to the output bus. Consider the table of bit states of FIG. 18.

Again we have created the same sample output values (in the # column) as in the last example. Note that, for example, Bit10 and Bit10b are now both zero at the same time (as are Bit11/Bit11b and Bit12/Bit12b). By using the 'duplicate input device' method, certain sections of the DAC can be shut off This shutting off is possible when the DAC number is such that MSB sections are not needed. Alternative embodiments achieve this. A third pair of devices may have been added to the 'reversing switch' arrangement. But this is a convenient embodiment to shut off the DAC sections that are not needed to implement small numerical values, i.e. small coefficient values in our example. The consequence is that no current flows in certain multiplying elements and current consumption is less, so noise is less.

Unlike in these simplified example embodiments where a weighted resistor network is shown associated with each DAC, in a complete filter embodiment, the resistor network occurs one time at the very 'top' of the filter. Consequently, as the coefficients rotate and certain of them implement this "off state" in certain multipliers, the current does not change in the weighting resistors. There is no "common mode" glitch or similar effect due to the current turning on and off; the same (lower than before) current always flows.

Use of One Weighted Resistor Network Per Pair of FIRs in a Complex Filter

Figure 19:
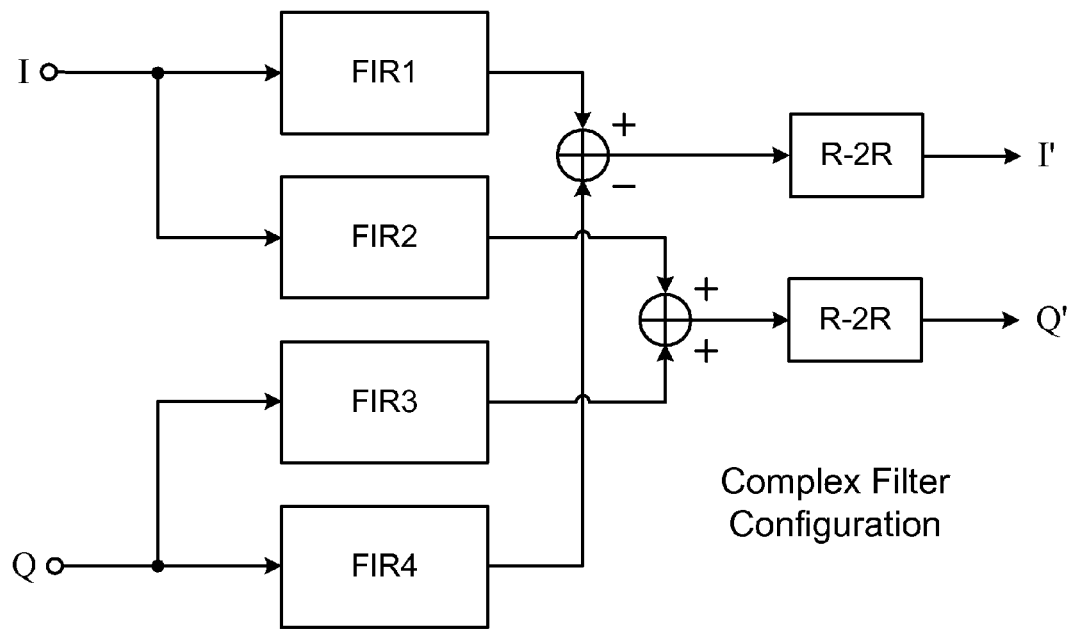
FIG. 19 shows a block diagram of a complex filter sharing a common resistor network between multiple real filter components of the complex filter.

A 'complex filter' in this context refers to a filter designed to operate upon data represented as complex numbers. These kinds of filter are common in communication systems. A complex filter is desirable in certain circumstances due to its ability to distinguish positive and negative frequencies. A complex filter is made from real filters as in FIG. 19. Four FIR filters of the conventional kind are used. They generally differ in coefficient values, but in the typical case the FIR1 and FIR3 will have the same coefficients, as will FIR2 and FIR4. The outputs are summed (or subtracted) to deliver the signal at the two output ports. These FIR filters built with the techniques described, may implement the sum and difference in the current domain, that is, before use of the weighted resistor networks. Consequently only two such resistor networks are used, rather than four such resistor networks. The two channels that are added or subtracted can be implemented interleaved, with the DAC circuits for the I and Q representing different SHA signals, but the taps otherwise interleaved. This leads to excellent matching of coefficient value and good rejection of errors.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. An apparatus, comprising:
   a complex filter circuit including:
   a first finite impulse response filter including a first multiplier circuit generating an analog product output by performing multiplication of a differential analog input representing a real quantity and a multi-bit digital input representing a real quantity;
   a second finite impulse response filter including a second multiplier circuit generating an analog product output by performing multiplication of a differential analog input representing a real quantity and a multi-bit digital input representing an imaginary quantity;
   a third finite impulse response filter including a third multiplier circuit generating an analog product output by performing multiplication of a differential analog input representing an imaginary quantity and a multi-bit digital input representing a real quantity;
   a fourth finite impulse response filter including a fourth multiplier circuit generating an analog product output by performing multiplication of a differential analog input representing an imaginary quantity and a multi-bit digital input representing a real quantity,
   wherein multiple finite impulse response filters of the complex filter circuit share resistor networks to perform weighted addition.

2. The apparatus of claim 1, wherein multiple finite impulse response filters of the complex filter circuit share resistor networks to perform weighted addition, in that the first multiplier circuit and the fourth multiplier circuit share a common resistor network to perform weighted addition.

3. The apparatus of claim 1, wherein multiple finite impulse response filters of the complex filter circuit share resistor networks to perform weighted addition, in that the second multiplier circuit and the third multiplier circuit share a common resistor network to perform weighted addition.

4. The apparatus of claim 1, wherein multiple finite impulse response filters of the complex filter circuit share resistor networks to perform weighted addition, in that the first multiplier circuit and the fourth multiplier circuit share a first common resistor network to perform weighted addition, and in that the second multiplier circuit and the third multiplier circuit share a second common resistor network to perform weighted addition.

\* \* \* \* \*